(12) United States Patent
Li et al.

(10) Patent No.: US 9,425,296 B2
(45) Date of Patent: Aug. 23, 2016

(54) VERTICAL TUNNEL FIELD EFFECT TRANSISTOR

(71) Applicant: QUALCOMM Incorporated, San Diego, CA (US)

(72) Inventors: Xia Li, San Diego, CA (US); Ming Cai, San Diego, CA (US); Bin Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 15 days.

(21) Appl. No.: 14/021,795

(22) Filed: Sep. 9, 2013

(65) Prior Publication Data

US 2015/0069458 A1    Mar. 12, 2015

(51) Int. Cl.
*H01L 29/66* (2006.01)
*H01L 29/78* (2006.01)
*H01L 29/739* (2006.01)

(52) U.S. Cl.
CPC .... *H01L 29/66977* (2013.01); *H01L 29/66356* (2013.01); *H01L 29/66795* (2013.01); *H01L 29/7391* (2013.01); *H01L 29/7827* (2013.01)

(58) Field of Classification Search
CPC ..... H01L 29/7391; H01L 29/00; H01L 29/66; H01L 29/66795; H01L 29/66977; H01L 29/7827
USPC .......................................................... 257/105
See application file for complete search history.

(56) References Cited

U.S. PATENT DOCUMENTS

| | | | |
|---|---|---|---|
| 7,742,328 B2 * | 6/2010 | Chen | B82Y 10/00 365/148 |
| 8,026,509 B2 | 9/2011 | Goel et al. | |
| 8,134,142 B2 | 3/2012 | Hurkx et al. | |
| 8,471,329 B2 | 6/2013 | Bhuwalka et al. | |
| 2007/0228491 A1 | 10/2007 | Forbes | |
| 2008/0067495 A1 | 3/2008 | Verhulst | |
| 2009/0121263 A1 | 5/2009 | Hikida | |
| 2010/0155842 A1 * | 6/2010 | Anderson | H01L 29/66795 257/347 |
| 2012/0267609 A1 | 10/2012 | Liang et al. | |
| 2012/0278777 A1 | 11/2012 | Lin et al. | |
| 2013/0230954 A1 * | 9/2013 | Loh | H01L 29/66477 438/268 |

FOREIGN PATENT DOCUMENTS

DE    19943390 A1    5/2001
EP    2378557 A1    10/2011

OTHER PUBLICATIONS

International Search Report and Written Opinion for International Application No. PCT/US2014/054066, ISA/EPO, Dec. 3, 2014, 16 pages.

* cited by examiner

*Primary Examiner* — Monica D Harrison
(74) *Attorney, Agent, or Firm* — Toler Law Group

(57) ABSTRACT

A tunnel field transistor (TFET) device includes a fin structure that protrudes from a substrate surface. The fin structure includes a base portion proximate to the substrate surface, a top portion, and a first pair of sidewalls extending from the base portion to the top portion. The first pair of sidewalls has a length corresponding to a length of the fin structure. The fin structure also includes a first doped region having a first dopant concentration at the base portion of the fin structure. The fin structure also includes a second doped region having a second dopant concentration at the top portion of the fin structure. The TFET device further includes a gate including a first conductive structure neighboring a first sidewall of the first pair of sidewalls. A dielectric layer electrically isolates the first conductive structure from the first sidewall.

22 Claims, 12 Drawing Sheets

VERTICAL TUNNEL FIELD EFFECT TRANSISTOR

I. FIELD

The present disclosure is generally related to a vertical tunnel field effect transistor.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, may communicate voice and data packets over wireless networks. Further, many such wireless telephones include other types of devices that are incorporated therein. For example, a wireless telephone may also include a digital still camera, a digital video camera, a digital recorder, and an audio file player. Also, such wireless telephones may process executable instructions, including software applications, such as a web browser application, that may be used to access the Internet. As such, these wireless telephones may include significant computing capabilities.

A semiconductor device for use in wireless communication devices may include transistors (e.g., complementary metal-oxide-semiconductor (CMOS) transistors) that form logic circuits within the semiconductor device. Each CMOS transistor may include a gate, a source region, and a drain region. Upon activation, a gate bias of a traditional CMOS transistor may cause the formation of an accumulation region channel between the source region and the drain region to permit current flow from the source region to the drain region. In contrast, a tunnel CMOS transistor may enable current flow as a result of band-to-band tunneling in a channel enabled by an applied gate bias. However, because tunnel CMOS transistors are typically planar, such tunnel CMOS transistors may present scaling challenges for sub-22 nanometer (nm) process dimensions and beyond.

III. SUMMARY

A vertical tunnel field effect transistor (TFET) and a method of fabrication are disclosed. A fin-type vertical TFET may include a source region and a drain region that are vertically coupled via a channel region. A vertical tunnel may be formed within the channel region to create a conduction path between the source region and the drain region. The length of the vertical tunnel may be dependent on the height of the channel region. The fin-type vertical TFET may also include a gate with an adjustable width. For example, an amount of saturation current that flows through the vertical tunnel may be adjusted (e.g., increased or decreased) in response to changing the width of the gate.

In a particular embodiment, a tunnel field transistor (TFET) device includes a fin structure that protrudes from a substrate surface. The fin structure includes a base portion proximate to the substrate surface, a top portion, and a first pair of sidewalls extending from the base portion to the top portion. The first pair of sidewalls has a length corresponding to a length of the fin structure. The fin structure also includes a first doped region having a first dopant concentration at the base portion of the fin structure. The fin structure also includes a second doped region having a second dopant concentration at the top portion of the fin structure. The TFET device further includes a gate including a first conductive structure neighboring a first sidewall of the first pair of sidewalls. A dielectric layer electrically isolates the first conductive structure from the first sidewall.

In another particular embodiment, a method includes fabricating a vertical tunnel field effect transistor (TFET) device. Fabricating the vertical TFET device includes forming a well region, a base portion, a central portion, and a top portion within a substrate. The base portion protrudes from a surface of the well region, and the central portion is formed between the base portion and the top portion. Fabricating the vertical TFET device also includes etching the substrate to form a vertical fin structure. The vertical fin structure includes the base portion, the central portion, and the top portion. Fabricating the vertical TFET device further includes depositing a dielectric layer on the vertical fin structure and depositing a first gate material on the dielectric layer.

In another particular embodiment, an apparatus includes means for providing charge carriers to a tunneling channel and means for receiving the charge carriers from the tunneling channel. One of the means for providing or the means for receiving is at a base portion of a fin structure and is adjacent to a substrate surface. The other of the means for providing or the means for receiving is at a top portion of the fin structure. The apparatus also includes means for biasing the tunneling channel to enable band-to-band tunneling at the tunneling channel.

One particular advantage provided by at least one of the disclosed embodiments is an ability to form band-to-band tunneling currents in channels of tunnel field effect transistors for sub-22 nanometer (nm) process dimensions and beyond. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Particular embodiments of vertical tunnel field effect transistor devices and methods of fabrication are presented in this disclosure. It should be appreciated, however, that the concepts and insights applied to the particular embodiments with respect to designs of the vertical tunnel field effect transistor devices and with respect to how to make the vertical tunnel field effect transistor devices may be embodied in a variety of contexts. The particular embodiments presented are merely illustrative of specific ways to design and make the vertical tunnel field effect transistor devices and do not limit the scope of this disclosure.

The present disclosure describes the particular embodiments in specific contexts. However, features, methods, structures or characteristics described according to the particular embodiments may also be combined in suitable manners to form one or more other embodiments. In addition, figures are used to illustrate the relative relationships between the features, methods, structures, or characteristics, and thus may not be drawn in scale. Directional terminology, such as "top," "central," "base," etc. is used with reference to the orientation of the figures being described. The components of the disclosure may be positioned in a number of different orientations. As such, the directional terminology is used for purposes of illustration and is not meant to be limiting.

Figure 1:
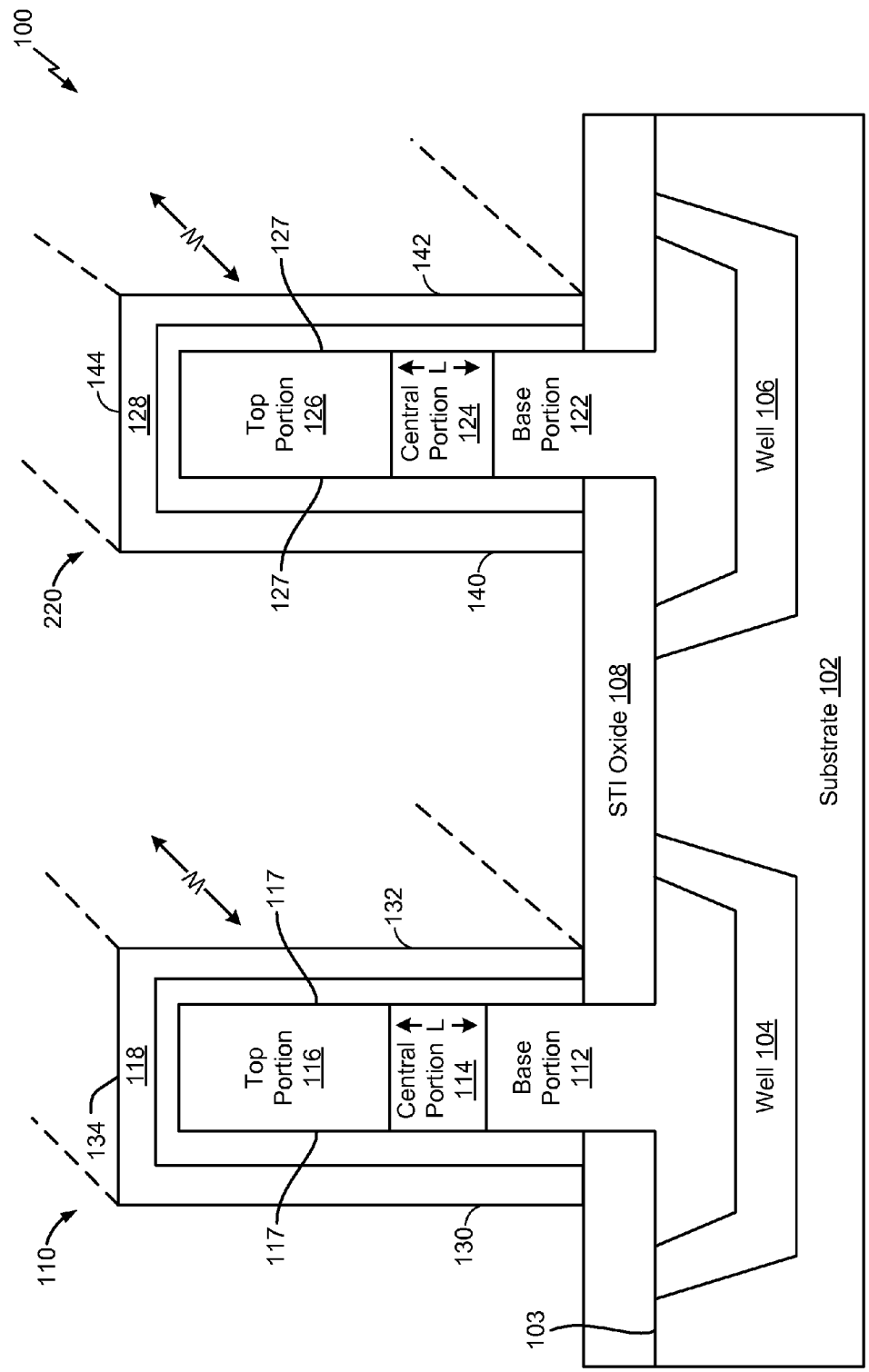
FIG. 1 is a diagram of a particular illustrative embodiment of a vertical tunnel field effect transistor device.

Referring to FIG. 1, a particular illustrative embodiment of a fin-type vertical tunnel field effect transistor (TFET) device 100 is shown. FIG. 1 shows a cross-sectional view of a portion of the vertical TFET device 100.

The vertical TFET device 100 includes a substrate 102 and a shallow trench isolation (STI) oxide layer 108. The substrate 102 may be a p-type substrate. In a particular embodiment, the substrate 102 is a silicon (Si) substrate. The STI oxide layer 108 may prevent electrical current leakage between adjacent semiconductor device components. For example, the STI oxide layer 108 may prevent electrical current leakage between the vertical TFET device 100 and another semiconductor device component (e.g., another vertical TFET device).

The vertical TFET device 100 includes a first vertical TFET 110 that includes a first well region 104, a first base portion 112, a first central portion 114, and a first top portion 116. In a particular embodiment, the first base portion 112, the first central portion 114, and the first top portion 116 are made of a same type of material. For example, the first base portion 112, the first central portion 114, and the first top portion 116 may be made of silicon (Si). In another particular embodiment, the portions 112-116 may be made of at least one III-V material. For example, the portions 112-116 may be made of aluminum arsenide, gallium arsenide, gallium nitride, gallium phosphide, indium antimonide, indium arsenide, indium phosphide, or any combination thereof. In another particular embodiment, the portions 112-116 may be made of at least one II-VI material. The first base portion 112 may be adjacent to (e.g., proximate to) the surface 103 of the substrate 102. The first base portion 112 may correspond to a first doped region having a first dopant concentration, and the first top portion 116 may correspond to a second doped region having a second dopant concentration. The first vertical TFET 110 may also include a first pair of sidewalls 117 extending from the first base portion 112 to the first top portion 116. A first dielectric layer (e.g., a material having a high dielectric constant (k)) may be deposited around the sidewalls 117.

The first base portion 112, the first central portion 114, the first top portion 116, and the first pair of sidewalls 117 correspond to a first fin structure. The first central portion 114 may correspond to a channel region of the first fin structure, and a channel length (L) may correspond to a height of the first central portion 114. In a particular embodiment, the first top portion 116 may correspond to a drain of the first fin structure and the first base portion 112 may correspond to a source of the first fin structure. In another particular embodiment, the first top portion 116 may correspond to a source of the first fin structure and the first base portion 112 may correspond to a drain of the first fin structure. The first fin structure may protrude from the surface 103 of the substrate 102. The first vertical TFET 110 may also include a first gate 118 that includes a first conductive structure 130 that is adjacent to (e.g., neighboring) at least one sidewall of the first pair of sidewalls 117. The first gate 118 may also include a second conductive structure 132 that is adjacent to (e.g., neighboring) at least one other sidewall of the first pair of sidewalls 117 and a third conductive structure 134 that is adjacent to (e.g., neighboring) the first top portion 116. The third conductive structure 134 may be coupled to the first conductive structure 130 and to the second conductive structure 132. A width (w) of the first gate 118 may be changed to adjust a saturation current of the first vertical TFET 110. The first dielectric layer may electrically isolate the conductive structures 130-134 (e.g., the first gate 118) from the sidewalls 117 and from the first top portion 116, respectively.

The vertical TFET device 100 also includes a second vertical TFET 120 that includes a second well region 106, a second base portion 122, a second central portion 124, and a second top portion 126. In a particular embodiment, the second base portion 122, the second central portion 124, and the second top portion 126 are made of a same type of material. For example, the second base portion 122, the second central portion 124, and the second top portion 126 may be made of silicon (Si). The second base portion 122 may also be adjacent to (e.g., proximate to) the surface 103 of the substrate 102. The second base portion 122 may correspond to a third doped region having a third dopant concentration, and the second top portion 126 may correspond to a fourth doped region having a fourth dopant concentration. The second vertical TFET 120 may also include a second pair of sidewalls 127 extending from the second base portion 122 to the second top portion 126. A second dielectric layer (e.g., a material having a high dielectric constant (k)) may be deposited around the sidewalls 127.

The second base portion 122, the second central portion 124, the second top portion 126, and the second pair of sidewalls 127 correspond to a second fin structure. The second central portion 124 may correspond to a channel of the second fin structure, and a channel length (L) may correspond to a height of the second central portion 124. The channel length (L) of the first central portion 114 may be equal to (or substantially equal to) the channel length (L) of the second central portion 124. Alternatively, the first central portion 114 and the second central portion 124 may have different channel lengths (L).

In a particular embodiment, the second top portion 126 may correspond to a drain of the second fin structure and the second base portion 122 may correspond to a source of the second fin structure. In another particular embodiment, the second top portion 126 may correspond to a source of the second fin structure and the second base portion 122 may correspond to a drain of the second fin structure. The second fin structure protrudes from the surface 103 of the substrate 102. The second vertical TFET 120 may also include a second gate 128 that includes a first conductive structure 140 that is adjacent to (e.g., neighboring) at least one sidewall of the second pair of sidewalls 127. The second gate 128 may also include a second conductive structure 142 that is adjacent to (e.g., neighboring) at least one other sidewall of the second pair of sidewalls 127 and a third conductive structure 144 that is adjacent to (e.g., neighboring) the second top portion 126. The third conductive structure 144 may be coupled to the first conductive structure 140 and to the second conductive structure 142. As further illustrated in FIG. 9, a width of the second gate 128 may be changed to adjust a saturation current of the second vertical TFET 120. The second dielectric layer may electrically isolate the conductive structures 140-144 (e.g., the second gate 128) from the sidewalls 127 and from the second top portion 126, respectively.

In a particular embodiment, the first vertical TFET 110 and the second vertical TFET 120 are complementary TFETs. For example, the first vertical TFET 110 may be an n-type TFET and the second vertical TFET 120 may be a p-type TFET. Alternatively, the first vertical TFET 110 may be a p-type TFET and the second vertical TFET 120 may be an n-type TFET.

Three particular embodiments of the vertical TFET device 100 are described below. In each embodiment, the first vertical TFET 110 is an n-type TFET and the second vertical TFET 120 is a p-type TFET. For example, the first gate 118 may be comprised of a metal having an n-type work function and the second gate 128 may be comprised of a metal having a p-type work function. These embodiments are described for purposes of illustration and are not meant to be limiting. For example, in other embodiments, the first vertical TFET 110 may be an n-type TFET and the second vertical TFET 120 may be a p-type TFET, each vertical TFET 110, 120 may be a p-type TFET, or each vertical TFET 110, 120 may be an n-type TFET.

In a first particular embodiment, the first well region 104 and the second well region 106 may be doped with an n-type concentration. The first base portion 112 (e.g., the first doped region) may correspond to a source of the first fin structure having a first dopant concentration that includes a P+ concentration. For example, a p+ type silicon may be placed (e.g., implanted) in the substrate 102 and at the bottom of the first fin structure as a source. The first central portion 114 may have a dopant concentration that includes a P− concentration. For example, a p− type silicon may be placed (e.g., implanted) between the first top portion 116 and the first base portion 112 as a channel region. The first top portion 116 (e.g., the second doped region) may correspond to a drain of the first fin structure having a second dopant concentration that includes an N+ concentration. For example, an n+ type silicon may be placed (e.g., implanted) at the top of the first fin structure as a drain. In the first particular embodiment, the second base portion 122 (e.g., the third doped region) may correspond to a drain of the second fin structure having a third dopant concentration that includes a P+ concentration, the second central portion 124 may have a dopant concentration that includes an N− concentration, and the second top portion 126 (e.g., the fourth doped region) may correspond to a source of the second fin structure having a fourth dopant concentration that includes an N+ concentration.

As variance of a first particular embodiment, the first top portion 116 of the first vertical TFET 110 and the second top portion 126 of the second vertical TFET 120 can be comprised of different materials than the central portions 114, 124 and the base portions 112, 122. For example, the top portions 116, 126 can be an n-type metal, an n-type polysilicon, etc.

In a second particular embodiment, the first well region 104 and the second well region 106 may be doped with a p-type concentration. The first base portion 112 (e.g., the first doped region) may correspond to a drain of the first fin structure having a first dopant concentration that includes an N+ concentration. For example, an n+ type silicon may be placed in the substrate 102 and at the bottom of the first fin structure as a drain. The first central portion 114 may have a dopant concentration that includes a P− concentration. For example, a p− type silicon may be placed between the first top portion 116 and the first base portion 112 as a channel region. The first top portion 116 (e.g., the second doped region) may correspond to a source of the first fin structure having a second dopant concentration that includes a P+ concentration. For example, a p+ type silicon may be placed at the top of the first fin structure as a source. In the second particular embodiment, the second base portion 122 (e.g., the third doped region) may correspond to a source of the second fin structure having a third dopant concentration that includes an N+ concentration, the second central portion 124 may have a dopant concentration that includes an N− concentration, and the second top portion 126 (e.g., the fourth doped region) may correspond to a drain of the second fin structure having a fourth dopant concentration that includes a P+ concentration.

As variance of a second particular embodiment, the first top portion 116 of the first vertical TFET 110 and the second top portion 126 of the second vertical TFET 120 can be comprised of different materials than the central portions 114, 124 and the base portions 112, 122. For example, the top portions 116, 126 can be a p-type metal, a p-type polysilicon, etc.

In a third particular embodiment, the first well region 104 may be doped with an n-type concentration and the second well region 106 may be doped with a p-type concentration. The first base portion 112 (e.g., the first doped region) may correspond to a source of the first fin structure having a first dopant concentration that includes a P+ concentration. For example, a p+ type silicon may be placed in the substrate 102 and at the bottom of the first fin structure as a source. The first central portion 114 may have a dopant concentration that includes a P− concentration. For example, a p− type silicon may be placed between the first top portion 116 and the first base portion 112 as a channel region. The first top portion 116 (e.g., the second doped region) may correspond to a drain of the first fin structure having a second dopant concentration that includes an N+ concentration. For example, an n+ type silicon may be placed at the top of the first fin structure as a drain. In the third particular embodiment, the second base portion 122 (e.g., the third doped region) may correspond to a source of the second fin structure having a third dopant concentration that includes an N+ concentration, the second central portion 124 may have a dopant concentration that includes an N− concentration, the second top portion 126 (e.g., the fourth doped region) may correspond to a drain of the second fin structure having a fourth dopant concentration that includes a P+ concentration.

As variance of the third particular embodiment, the first top portion 116 of the first vertical TFET 110 and the second top portion 126 of the second vertical TFET 120 can be comprised of different materials than the central portions 114, 124 and the base portions 112, 122. For example, the first top portion 116 can be an n-type metal or an n-type polysilicon, and the second top portion 126 can be a p-type metal or a p-type polysilicon, etc.

Figure 9:
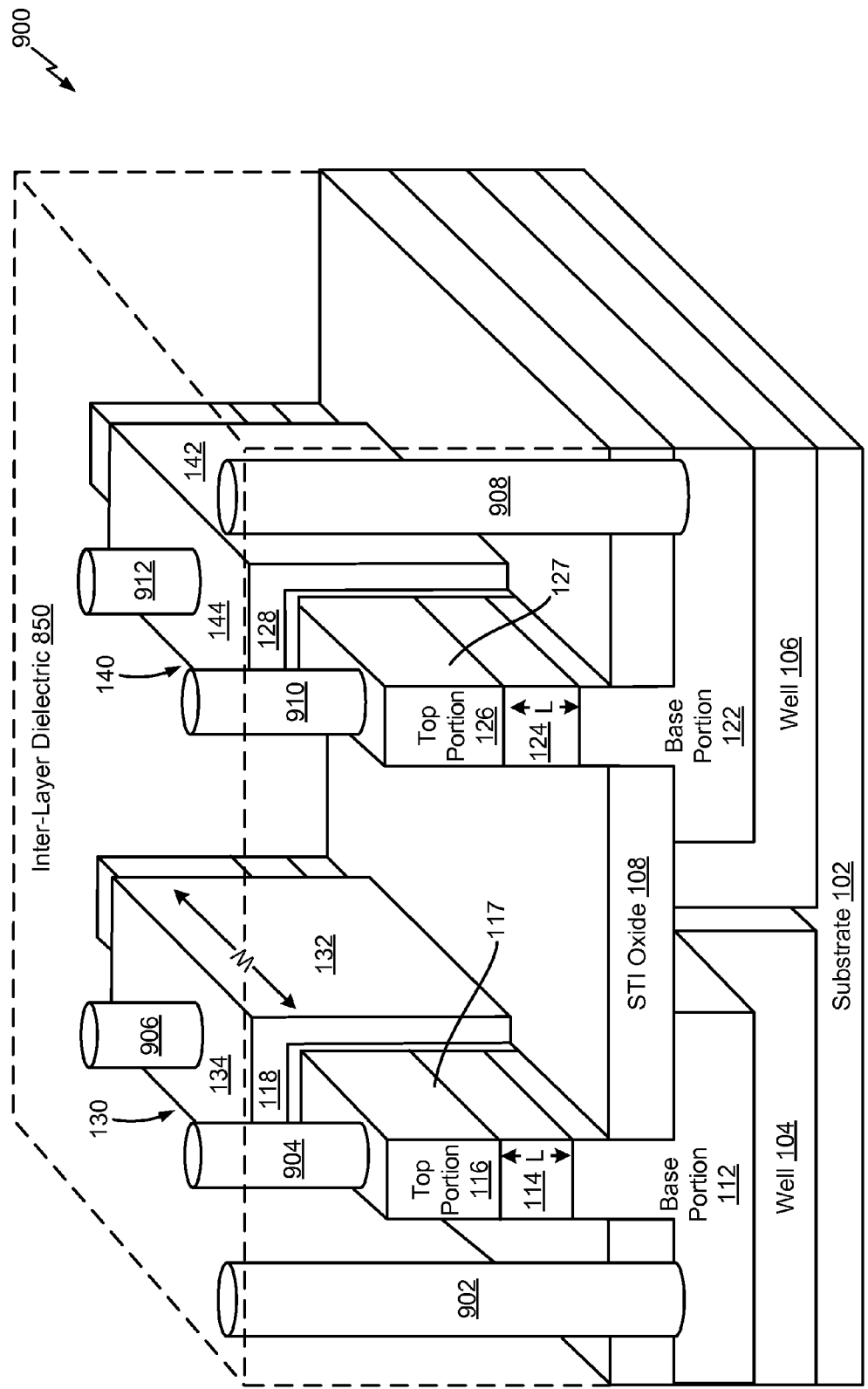
FIG. 9 is a diagram of a particular illustrative embodiment of a three-dimensional vertical tunnel field effect transistor device.

A first contact may be coupled to the first base portion 112, a second contact may be coupled to the first top portion 116, and a third contact may be coupled to the first gate 118, as further described with respect to FIG. 9. Voltages applied to each portion 112, 116, 118 via the contacts may cause a first vertical tunneling current to flow between the first top portion 116 and the first base portion 112 via a channel in the first central portion 114. A channel length (L) may defined by the height of the first central portion 114. For example, the length (L) of the channel may correspond to a thickness of a channel film in an embodiment where the first central portion 114 is grown or deposited on the first base portion 112. Similarly, a fourth contact may be coupled to the second base portion 122, a fifth contact may be coupled to the second top portion 126, and a sixth contact may be coupled to the second gate 128. Voltages applied to the each portion 122, 126, 128 via the contacts may cause a second vertical tunneling current to flow between the second top portion 126 and the second base portion 122 via a channel in the second central portion 124. A channel length (L) may be defined by the height of the second central portion 124.

It will be appreciated that the first central portion 114 and the second central portion 124 may permit the formation of band-to-band tunneling currents in channels, where the lengths (L) of the channels are independent of the width of the gates 118, 128. The gates 118, 128 may be independently designed and/or adjusted to manage an amount of saturation current supported by the vertical TFETs 110, 120 without affecting the length (L) of the channels. The height of the central portions 114, 124 (e.g., the channel lengths) may also be designed independently of a lithography process used for designing the gates. For example, because the channel is vertical (as opposed to planar), the channel is not limited to a region or a location that is under a planar gate of a field effect transistor.

Figure 2:
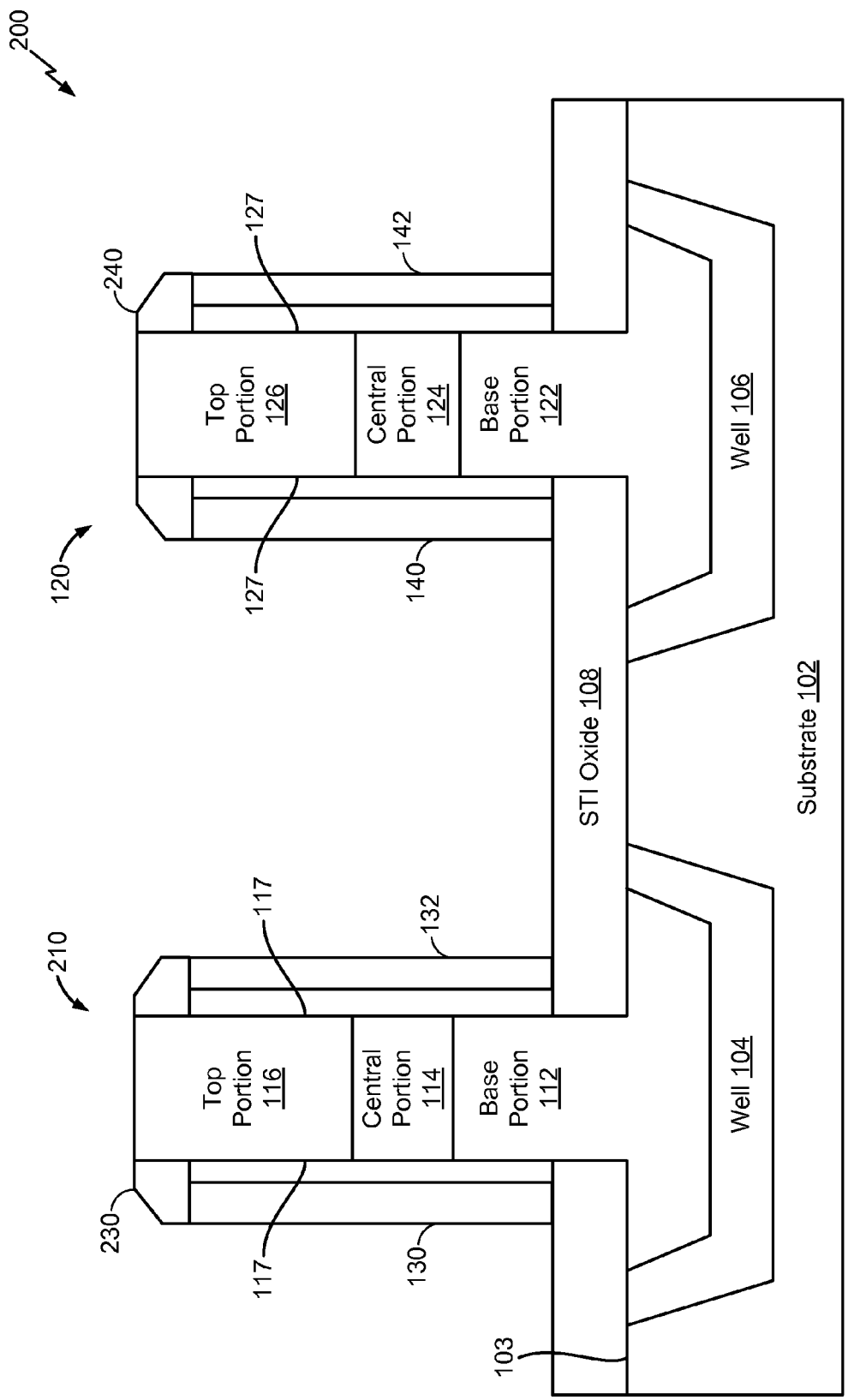
FIG. 2 is a diagram of another particular illustrative embodiment of a vertical tunnel field effect transistor device.

Referring to FIG. 2, another particular illustrative embodiment of a fin-type vertical tunnel field effect transistor device 200 is shown. FIG. 2 shows a cross-sectional view of a portion of the vertical TFET device 200.

The vertical TFET device 200 may include a first vertical TFET 210 and a second vertical TFET 220. The first vertical TFET 210 and the second vertical TFET 220 may correspond to the first vertical TFET 110 of FIG. 1 and the second vertical TFET 120 of FIG. 1, respectively, and may operate in a substantially similar manner. For example, the first vertical TFET 210 may include the first base portion 112, the first central portion 114, the first top portion 116, the first pair of sidewalls 117, the first conductive structure 130, and the second conductive structure 132. The second vertical TFET 220 may include the second base portion 122, the second central portion 124, the second top portion 126, the second pair of sidewalls 127, the first conductive structure 140, and the second conductive structure 142.

The first vertical TFET 210 may include a first hard mask film 230 that is deposited on the first gate 118 and on the first pair of sidewalls 117. The second vertical TFET 220 may include a second hard mask film 240 that is deposited on the second gate 128 and on the second pair of sidewalls 127. The hard mask films 230, 240 may be deposited during fabrication as described with respect to FIG. 5.

It will be appreciated that the first top portion 116 and the second top portion 126 of the vertical TFETs 210, 220, respectively, are not covered by a gate material. As a result, contacts may be vertically coupled to the first top portion 116 and to the second top portion 126 from above the fin-type vertical tunnel field effect transistor device 200. Vertically coupling the contacts to the first top portion 116 and to the second top portion 126 may reduce series parasitic resistance in the vertical TFETs 210, 220.

For ease of illustration, the following description corresponds to fabrication stages for the first particular embodiment of the vertical TFET device 100 described with respect to FIG. 1. However, the fabrication stages may be modified to fabricate the second embodiment, the third embodiment, or any other embodiments.

Figure 3:
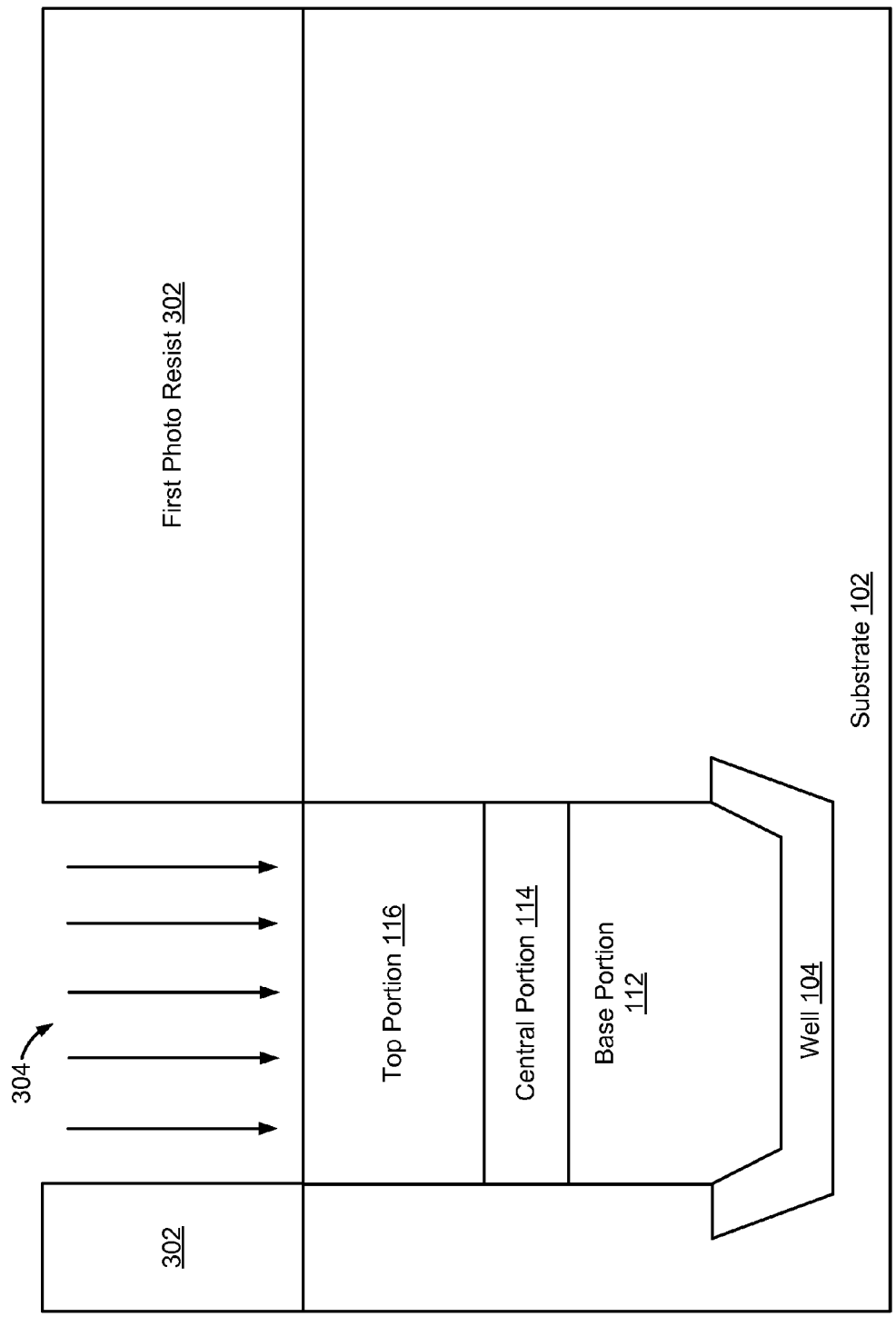
FIG. 3 is a diagram illustrating a particular stage of fabricating the vertical tunnel field effect transistor device of FIG. 1.

Referring to FIG. 3, a particular stage of fabricating the vertical tunnel field effect transistor device of FIG. 1 is shown. During the particular stage shown in FIG. 3, a first photoresist 302 may be patterned on top of the substrate 102. For example, the first photoresist 302 may be patterned to select (e.g., expose) a particular area of the substrate 102 to implant the first vertical TFET 110. After patterning the first photoresist 302, the first vertical TFET 110 may be implanted.

Implanting the first vertical TFET 110 may include implanting the first well region 104 in the substrate 102 using ion implantation 304. For example, n-type implantation may be performed in the substrate 102 to create the first well region 104. After the first well region 104 is implanted in the substrate 102, the first base portion 112 may be implanted in the first well region 104 using ion implantation 304. For example, P+ implantation may be performed in the first well region 104 to create the first base portion 112. After the first base portion 112 is implanted in the first well region 104, the first central portion 114 may be implanted on top of the first base portion 112 using ion implantation 304. For example, P− implantation may be performed in the substrate 102 and on top of the first base portion 112 to create the first central portion 114. After the first central portion 114 is implanted on the first base portion 112, the first top portion 116 may be implanted on top of the first central portion 114 using ion implantation 304. For example, N+ implantation may be performed in the substrate 102 and on top of the first central portion 114 to create the first top portion 116.

After the first vertical TFET 110 is implanted, the first photoresist 302 may be removed. For example, the first photoresist 302 may be removed via photoresist stripping to prevent the substrate 102 and the first vertical TFET 110 from being subjected to chemicals used during removal. In a particular embodiment, the first photoresist may be removed via organic photoresist stripping, inorganic photoresist stripping, or dry photoresist stripping.

Figure 4:
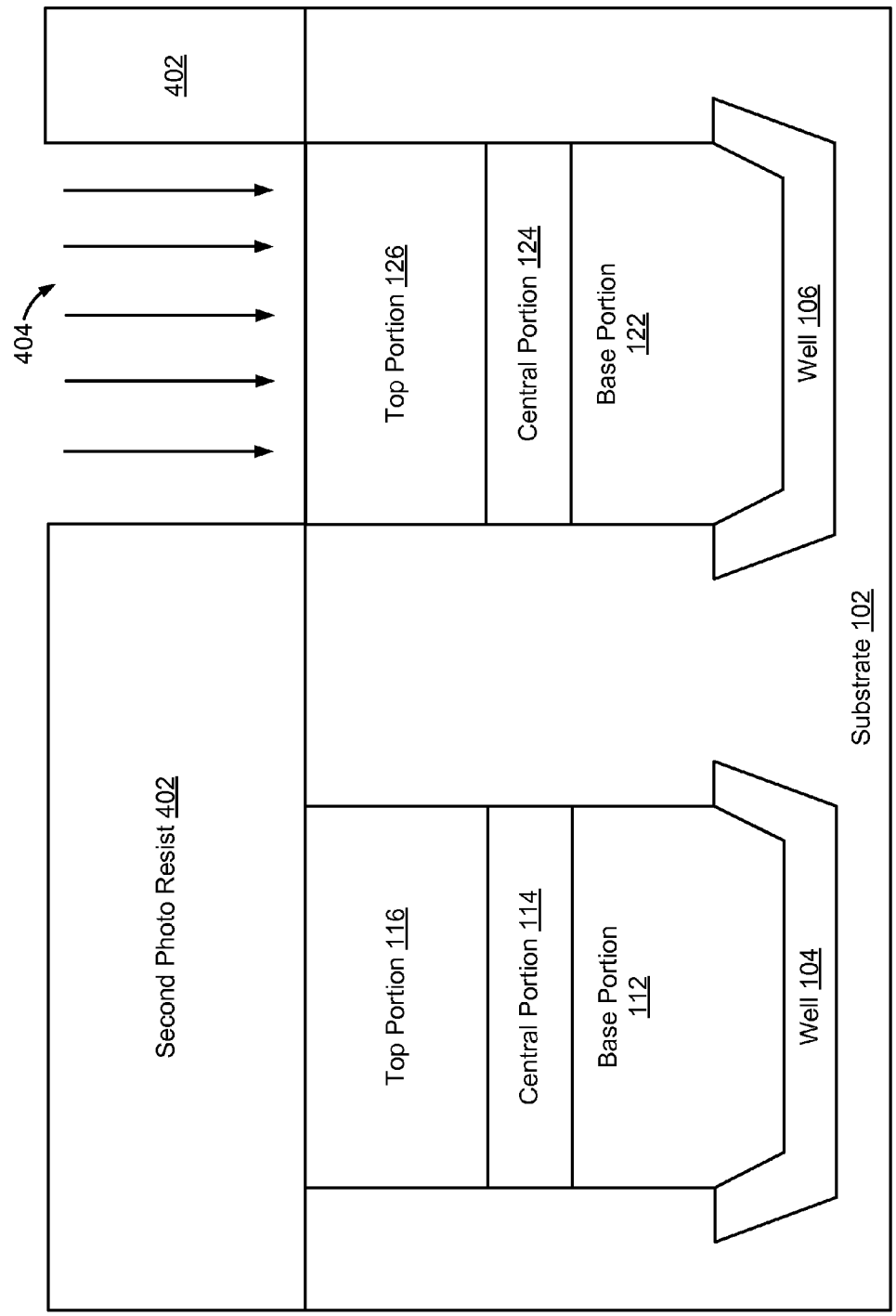
FIG. 4 is a diagram illustrating another stage of fabricating the vertical tunnel field effect transistor device of FIG. 1.

FIG. 3 illustrates implantation of the first vertical TFET 110 and FIG. 4 illustrates implantation of the second vertical TFET 120. During the particular stage shown in FIG. 4, a second photoresist 402 may be patterned on top of the substrate 102 and the first vertical TFET 110. For example, the second photoresist 402 may be patterned to select (e.g., expose) a particular area of the substrate 102 to implant the second vertical TFET 120. After patterning the second photoresist 402, the second vertical TFET 120 may be implanted.

Implanting the second vertical TFET 120 may include implanting the second well region 106 in the substrate 102 using ion implantation 404. For example, n-type implantation may be performed in the substrate 102 to create the second well region 106. After the second well region 106 is implanted in the substrate 102, the second base portion 122 may be implanted in the second well region 106 using ion implantation 404. For example, P+ implantation may be performed in the second well region 106 to create the second base portion 122. After the second base portion 122 is implanted in the second well region 106, the second central portion 124 may be implanted on top of the second base portion 122 using ion implantation 404. For example, P− implantation may be performed in the substrate 102 and on top of the second base portion 122 to create the second central portion 124. After the second central portion 124 is implanted on the second base portion 122, the second top portion 126 may be implanted on top of the second central portion 124 using ion implantation 404. For example, N+ implantation may be performed in the substrate 102 and on top of the second central portion 124 to create the second top portion 126.

After the second vertical TFET 120 is implanted, the second photoresist 402 may be removed. For example, the second photoresist 402 may be removed via photoresist stripping to prevent the substrate 102, the first vertical TFET 110, the second vertical TFET 120, or any combination thereof, from being subjected to chemicals used during removal.

Figure 5:
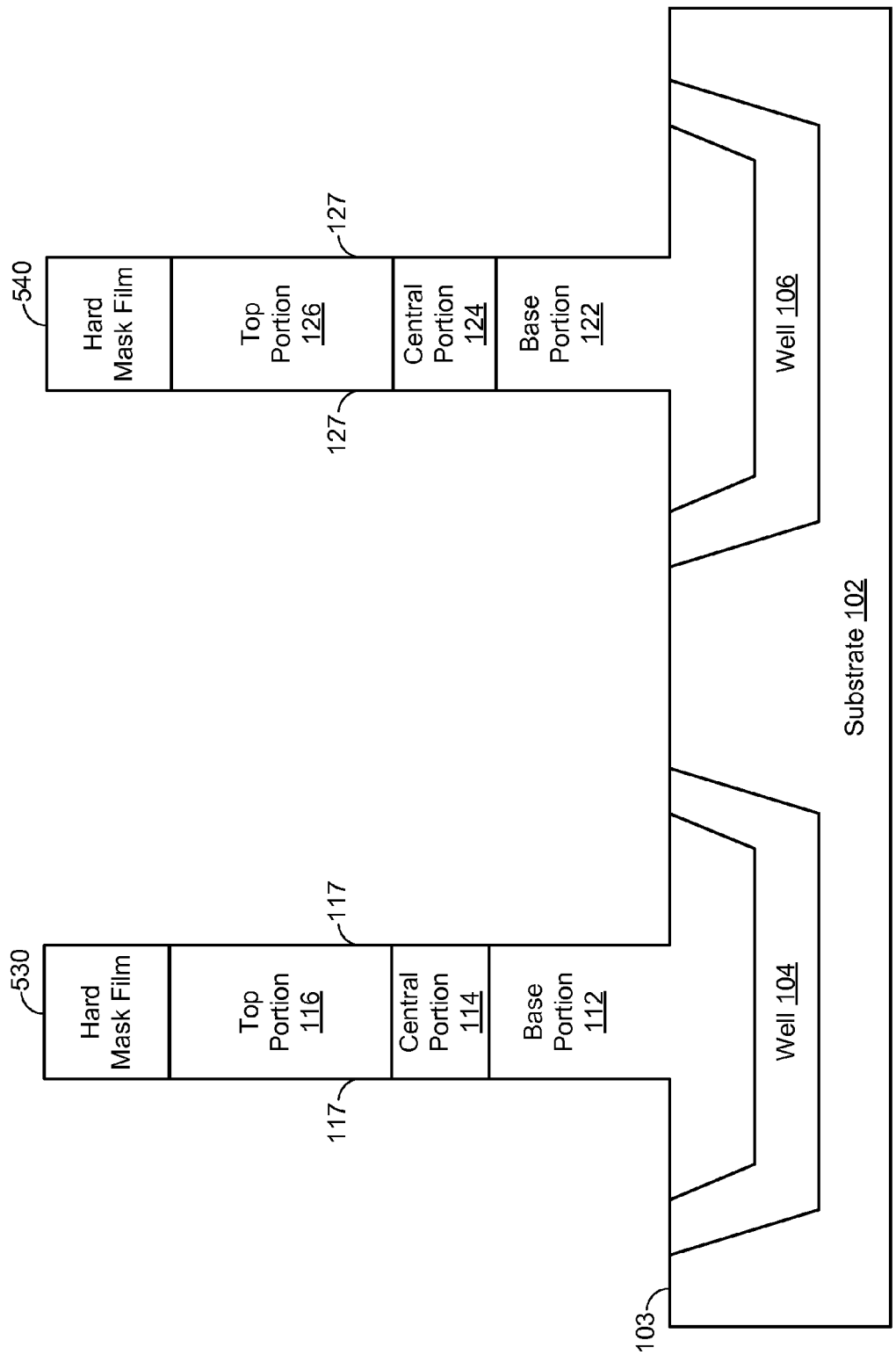
FIG. 5 is a diagram illustrating another particular stage of fabricating the vertical tunnel field effect transistor device of FIG. 1.

Referring to FIG. 5, another particular stage of fabricating the vertical tunnel field effect transistor device of FIG. 1 is shown. During the particular stage shown in FIG. 5, a first hard mask film 530 may be patterned on the first vertical TFET 110 and a second hard mask film 540 may be patterned on the second vertical TFET 120. For example, the first hard mask film 530 may be deposited on top of the first top portion 116 and the substrate 102. The second hard mask film 540 may be deposited on top of the second top portion 126 and the substrate 102. In a particular embodiment, the first hard mask film 530 and the second hard mask film 540 may be a single hard mask film deposited across the top of the vertical TFET device illustrated in FIG. 4 after the second photoresist 402 is removed.

The hard mask films 530, 540 may be patterned on top of the first top portion 116 and the second top portion 126, respectively, to protect areas beneath the hard mask films 530, 540 during etching. After patterning the hard mask films 530, 540, the first fin structure and the second fin structure may be etched from the substrate 102. For example, areas of the substrate 102 that are not protected by the hard mask films 530, 540 may be etched down to the well regions 104, 106.

Figure 6:
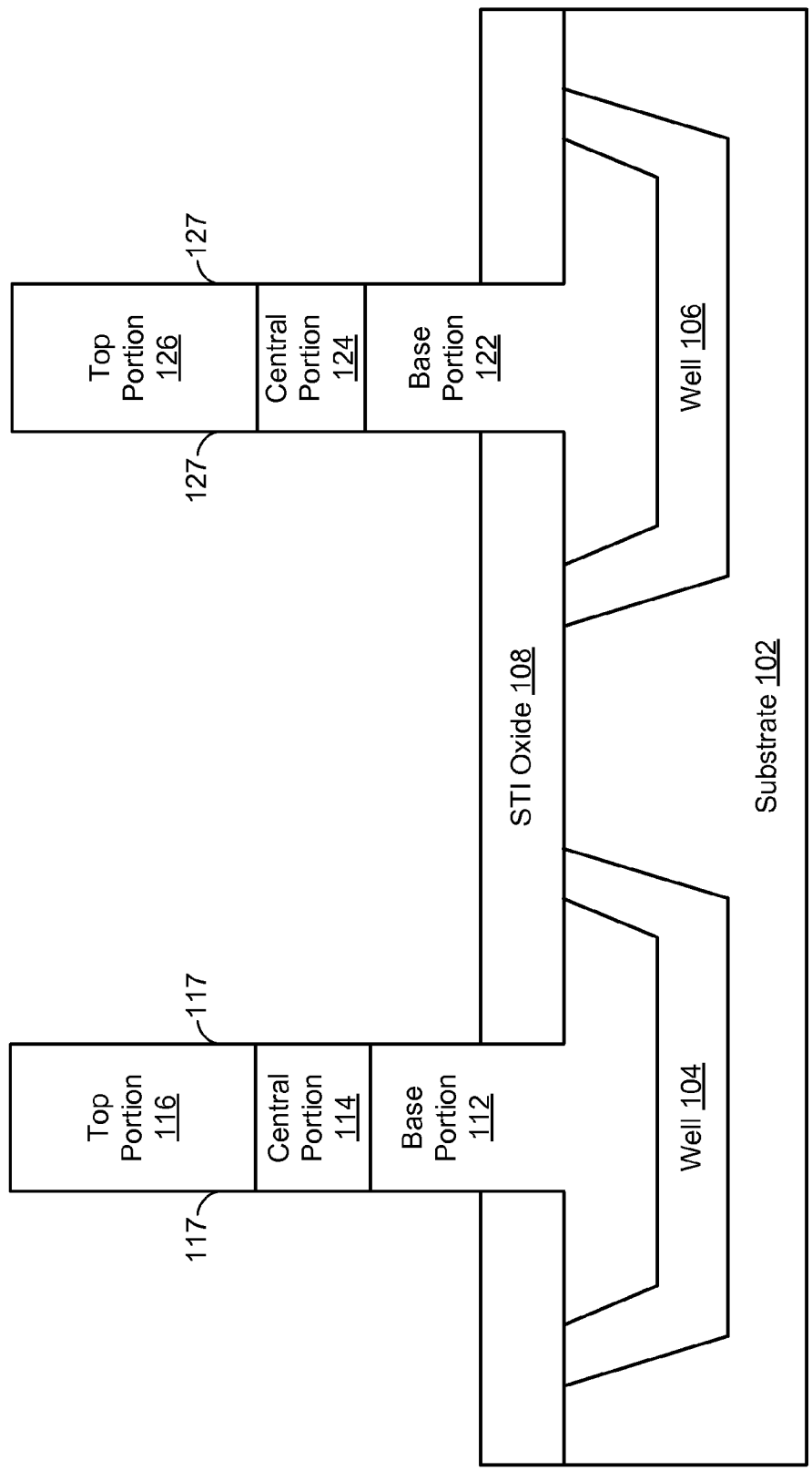
FIG. 6 is a diagram illustrating another stage of fabricating the vertical tunnel field effect transistor device of FIG. 1.

Referring to FIG. 6, another particular stage of fabricating the vertical tunnel field effect transistor device of FIG. 1 is shown. During the particular stage shown in FIG. 6, the STI oxide layer 108 is deposited. For example, the STI oxide layer 108 may be deposited on the substrate 102, the well regions 104, 106, and the particular areas of the base portions 112, 122 that are not protected by the hard mask films 530, 540. The STI oxide layer 108 may be polished (e.g., via a chemical and mechanical polishing (CMP) process) and recess etched. After the STI oxide layer 108 is etched, the hard mask films 530, 540 may be removed.

Figure 7:
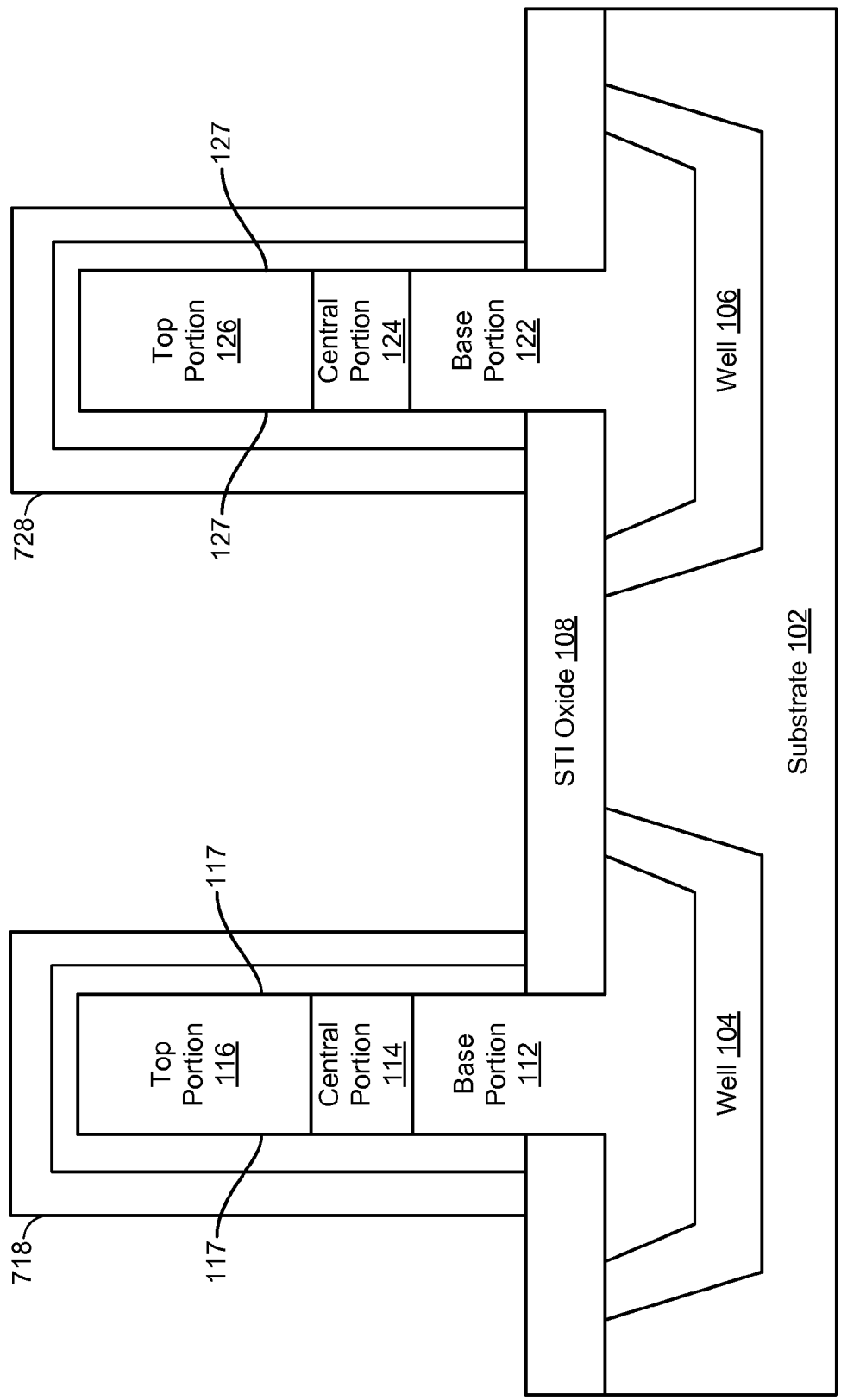
FIG. 7 is a diagram illustrating another particular stage of fabricating the vertical tunnel field effect transistor device of FIG. 1.

Referring to FIG. 7, another particular stage of fabricating the vertical tunnel field effect transistor device of FIG. 1 is shown. During the particular stage, the material having a high dielectric constant (k) may be deposited on the first fin structure. In addition, the material having a high dielectric constant (k) may be deposited on the second fin structure in a similar fashion. A first gate material 718 (e.g., poly-silicon) may be deposited and patterned around the first fin structure and a second gate material 728 (e.g., poly silicon) may be deposited and patterned around the second fin structure.

It will be appreciated that implanting and/or patterning a lightly doped drain (LDD) area may be bypassed by fabricating the vertical tunnel field effect transistor device. Fabricating the vertical tunnel field effect transistor may also relax a requirement for pattering the bottom of the base portions 112, 122 (e.g., source and/or drain regions).

Figure 8:
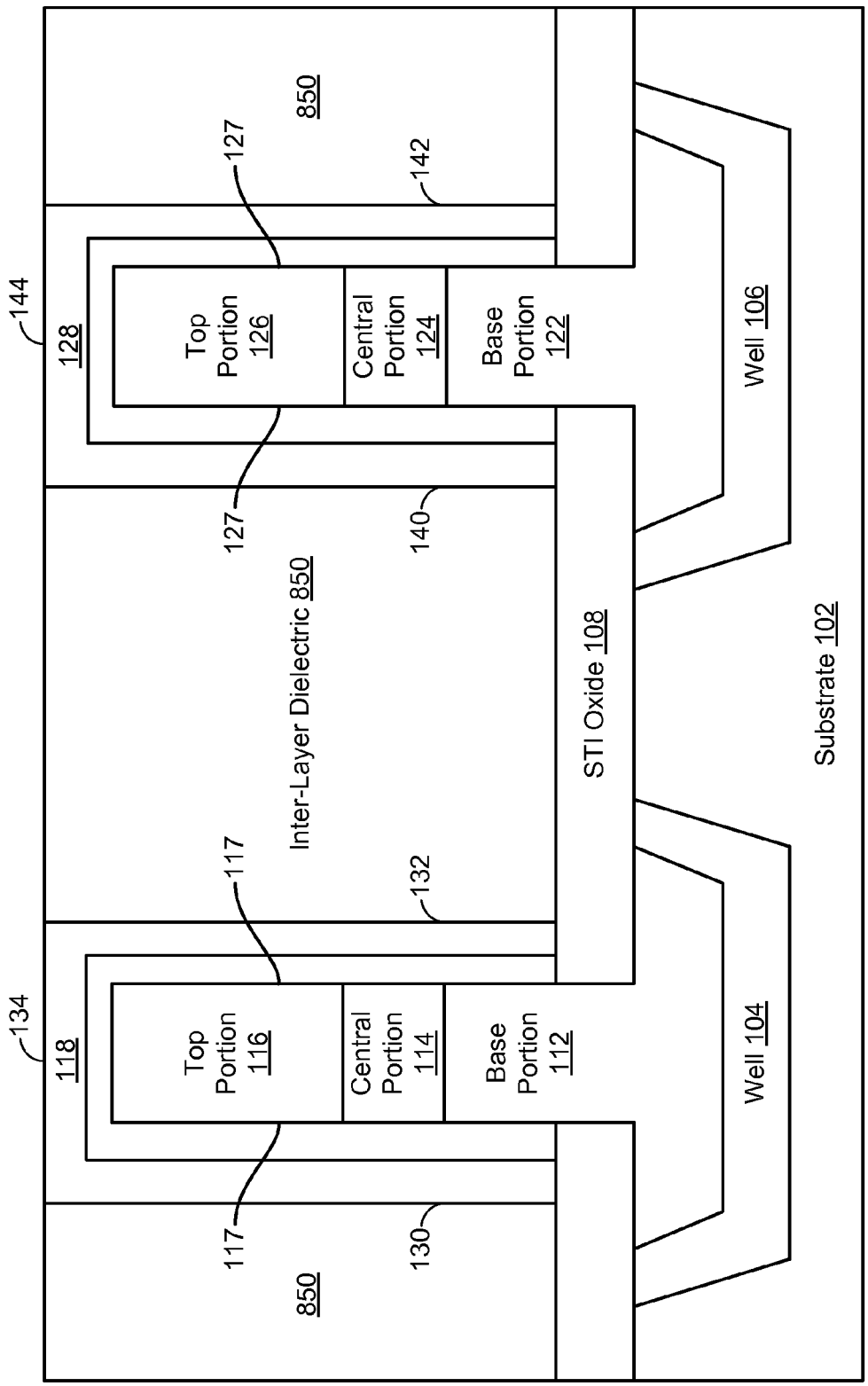
FIG. 8 is a diagram illustrating another particular stage of fabricating the vertical tunnel field effect transistor device of FIG. 1.

Referring to FIG. 8, another particular stage of fabricating the vertical tunnel field effect transistor device of FIG. 1 is shown. During the particular stage, an inter-layer dielectric oxide 850 is deposited. After depositing the inter-layer dielectric oxide 850, a CMP process is performed on the inter-layer dielectric oxide 850 to smooth the surface of the inter-layer dielectric oxide 850. The first gate material 718 may be removed and an n-type metal gate may be deposited to create the first gate 118. The second gate material 728 may also be removed and a p-type metal gate may be deposited to create the second gate 128.

As a result, the first central portion 114 and the second central portion 124 may permit the formation of band-to-band tunneling currents in channels, where the lengths (L) of the channels are independent of the width of the gates 118, 128. The gates 118, 128 may be independently designed and/or adjusted to manage an amount of saturation current supported by the vertical TFETs 110, 120 without affecting the length (L) of the channels. The height of the central portions 114, 124 (e.g., the channel lengths) may also be designed independently of a lithography process used for designing the gates. For example, because the channel is vertical (as opposed to planar), the channel is not limited to a region or a location that is under a planar gate of a field effect transistor.

Referring to FIG. 9, a particular illustrative embodiment of a three-dimensional vertical tunnel field effect transistor device 900 is shown. The three-dimensional vertical TFET device 900 may correspond to the vertical TFET device 100 of FIG. 1.

The vertical TFET device 900 may include a first contact 902 coupled to the first base portion 112, a second contact 904 coupled to the first top portion 116, and a third contact 906 coupled to the first gate 118. Voltages applied to each portion 112, 116, 118 via the respective contacts 902-906 may cause the first vertical tunneling current to flow between the first top portion 116 and the first base portion 112 via a channel in the first central portion 114, as described with respect to FIG. 1. The vertical TFET device 900 may also include a fourth contact 908 coupled to the second base portion 122, a fifth contact 910 coupled to the second top portion 126, and a sixth contact 912 coupled to the second gate 128. Voltages applied to each portion 122, 126, 128 via the respective contacts 908-912 may cause the second vertical tunneling current to flow between the second top portion 126 and the second base portion 122 via a channel in the second central portion 124.

Figure 10:
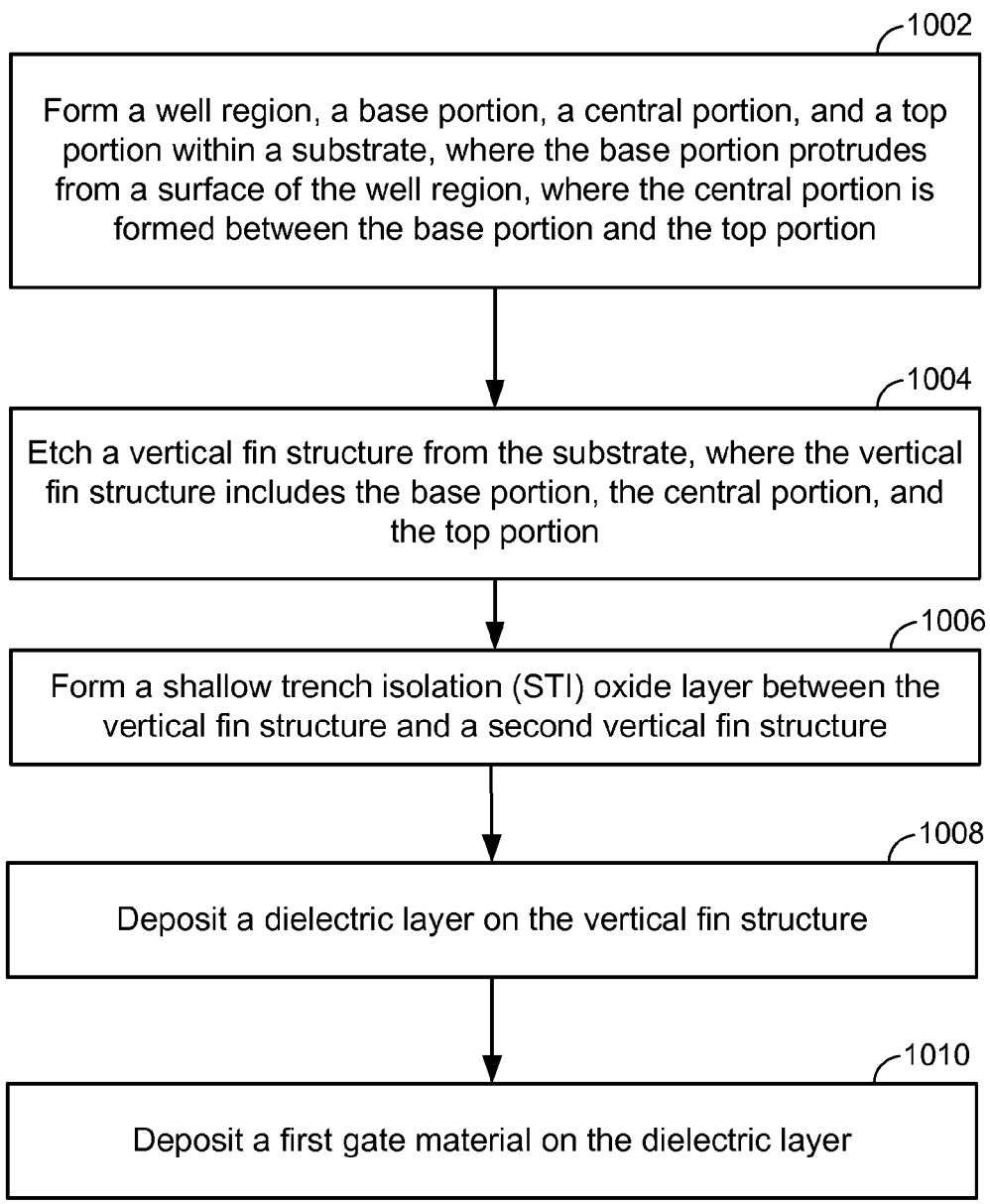
FIG. 10 is a flowchart of a particular illustrative embodiment of a method of fabricating a vertical tunnel field effect transistor device.

Referring to FIG. 10, a particular illustrative embodiment of a method 1000 of fabricating a vertical tunnel field effect transistor device is shown. The method 1000 of FIG. 10 may be performed to fabricate embodiments of the vertical TFET devices depicted in FIGS. 1-9.

The method 1000 includes forming a well region, a base portion, a central portion, and a top portion within a substrate, at 1002. For example, in FIG. 3, n-type implantation may be performed in the substrate 102 to create the first well region 104. After the first well region 104 is formed in the substrate 102, the first base portion 112 may be formed in the first well region 104 using ion implantation 304. For example, P+ implantation may be performed in the first well region 104 to create the first base portion 112. The first base portion 112 may protrude from a surface of the first well region 104. After the first base portion 112 is formed in the first well region 104, the first central portion 114 may be formed on top of the first base portion 112 using ion implantation 304. For example, P− implantation may be performed in the substrate 102 and on top of the first base portion 112 to create the first central portion 114. After the first central portion 114 is formed on the first base portion 112, the first top portion 116 may be formed on top of the first central portion 114 using ion implantation 304. For example, N+ implantation may be performed in the substrate 102 and on top of the first central portion 114 to create the first top portion 116.

A vertical fin structure may be etched, at 1004. For example, in FIG. 5, the hard mask films 530, 540 may be patterned on top of the first top portion 116 and the second top portion 126, respectively, to protect areas beneath the hard mask films 530, 540 during etching. After patterning the hard mask film 530, the first fin structure may be etched. For example, areas that are not protected by the hard mask films 530, 540 may be etched down to the well regions 104, 106. The remaining areas that are protected (e.g., underneath) the hard mask films 530, 540 may correspond to the first vertical fin structure.

A shallow trench isolation (STI) oxide layer may be formed between the vertical fin structure and a second vertical fin structure, at 1006. For example, in FIG. 6, the STI oxide film 108 may be formed between the structure corresponding to the first vertical TFET 110 and the structure corresponding to the second vertical TFET 120. The STI oxide film 108 may be formed on top of the hard mask films 530, 540 and on top of the top portions 116, 126. A CMP process for planarization may be performed until the hard mask films 530, 540 are reached. A recess etch may be performed and the hard mask films 530, 540 may be removed. The STI oxide layer 108 may be located on top of the surface 103 and between the base portions 112, 122 to isolate the vertical TFETs 110, 120.

A dielectric layer may be deposited on the vertical fin structure, at 1008. For example, in FIG. 7, the material having the high dielectric constant (k) may be deposited on the first fin structure. The first pair of sidewalls 117 may correspond to a dielectric layer. A first gate material may be deposited on the dielectric layer, at 1010. For example, in FIG. 7, the first gate material 718 (e.g., poly-silicon) may be deposited and patterned around the first pair of sidewalls 117.

In a particular embodiment, the method 1000 may include patterning a photoresist on the substrate prior to implanting the well region, the base portion, the central portion, and the top portion. For example, referring to FIG. 3, the first photoresist 302 is patterned on top of the substrate 102. For example, the first photoresist 302 may be patterned to select (e.g., expose) a particular area of the substrate 102 to implant the first vertical TFET 110. After patterning the first photoresist 302, the first vertical TFET 110 may be implanted.

In a particular embodiment, the method 1000 may include depositing a hard mask film on the top portion. For example, referring to FIG. 5, the first hard mask film 530 may be deposited on top of the first top portion 116 and the substrate 102, and the second hard mask film 540 may be deposited on top of the second top portion 126 and the substrate 102. In a particular embodiment, the first hard mask film 530 and the second hard mask film 540 may be a single hard mask film deposited across the top of the vertical TFET device illustrated in FIG. 4 after the second photoresist 402 is removed.

In a particular embodiment, the method 1000 may include patterning the hard mask film prior to etching the vertical fin structure from the substrate. For example, referring to FIG. 5, the hard mask films 530, 540 may be patterned on top of the first top portion 116 and the second top portion 126, respectively, to protect areas beneath the hard mask films 530, 540 during etching. After patterning the hard mask films 530, 540, the first fin structure and the second fin structure may be etched. For example, areas that are not protected by the hard mask films 530, 540 may be etched down to the well regions 104, 106.

In a particular embodiment, the method 1000 may include forming an oxide layer. For example, referring to FIG. 6, the STI oxide layer 108 may be deposited on the substrate 102 (on the well regions 104, 106 and on the particular areas of the base portions 112, 122 that are not protected by the hard mask films 530, 540). The STI oxide layer 108 may be polished using a chemical and mechanical polishing (CMP) process and etched. After the STI oxide layer 108 is etched, the hard mask films 530, 540 may be removed.

In a particular embodiment, the method 1000 may include depositing an inter-layer dielectric oxide on the first gate material. For example, referring to FIG. 8, the inter-layer dielectric oxide 850 may be deposited on the first gate material 718 and on the STI oxide layer 108. After depositing the inter-layer dielectric oxide 850, a CMP process is performed on the inter-layer dielectric oxide 850 to smooth the surface of the inter-layer dielectric oxide 850.

In a particular embodiment, the method 1000 may include removing the first gate material and depositing a gate metal. For example, referring to FIG. 8, the first gate material 718 may be removed and an n-type metal gate may be deposited to create the first gate 118. The second gate material 728 may also be removed and a p-type metal gate may be deposited to create the second gate 128.

As a result, the first central portion 114 and the second central portion 124 may permit the formation of band-to-band tunneling currents in channels, where the lengths (L) of the channels are independent of the width of the gates 118, 128. The gates 118, 128 may be independently designed and/or adjusted to manage an amount of saturation current supported by the vertical TFETs 110, 120 without affecting the length (L) of the channels. The height of the central portions 114, 124 (e.g., the channel lengths) may also be designed independently of a lithography process used for designing the gates. For example, because the channel is vertical (as opposed to planar), the channel is not limited to a region or a location that is under a planar gate of a field effect transistor.

Figure 11:
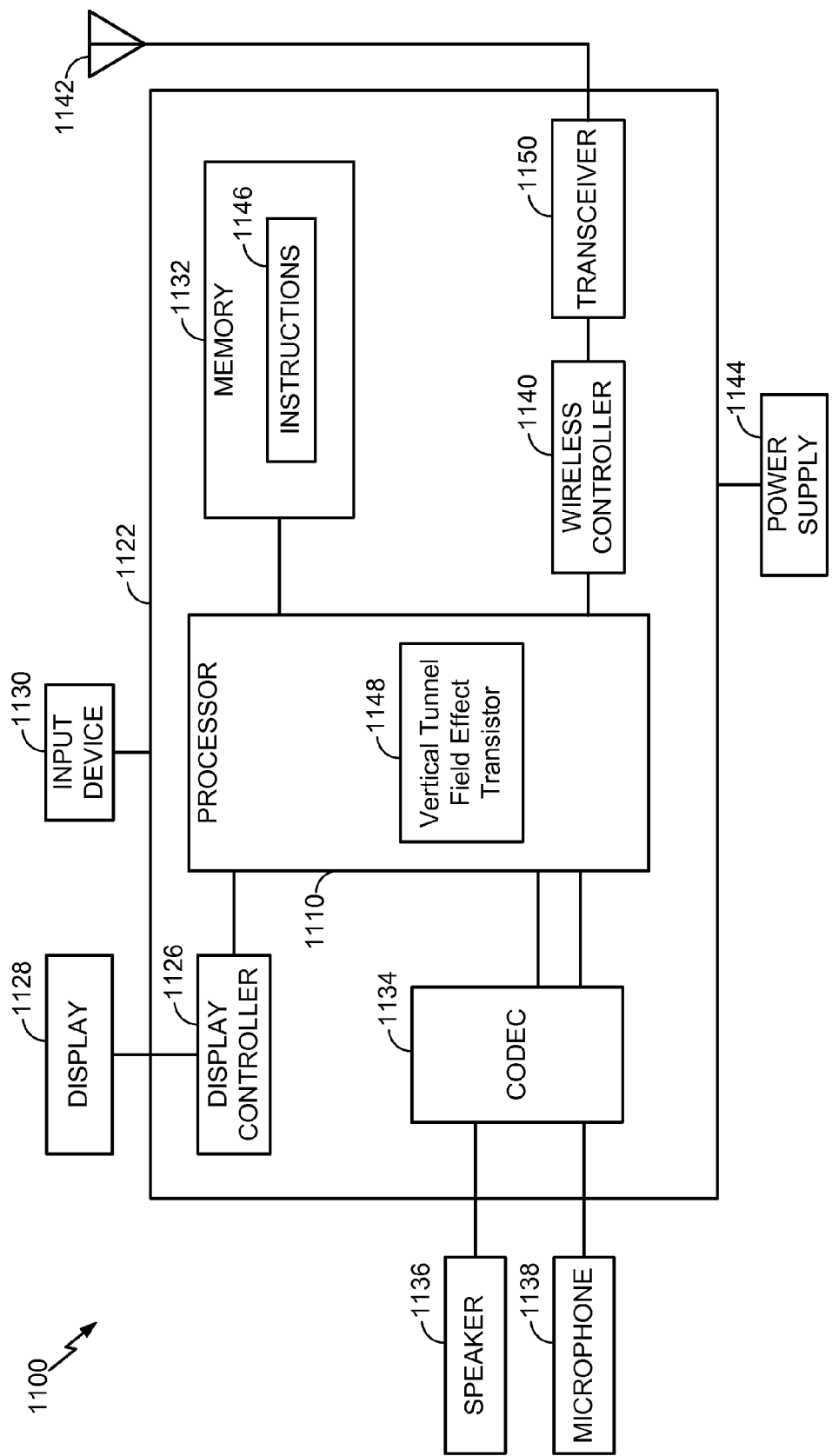
FIG. 11 is a block diagram of a wireless communication device including a vertical tunnel field effect transistor device.

Referring to FIG. 11, a block diagram of a particular illustrative embodiment of a wireless communication device is depicted and generally designated 1100. The device 1100 includes a processor 1110, such as a digital signal processor (DSP), coupled to a memory 1132 (e.g., a random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art). The memory 1132 may store instructions 1162 that are executable by the processor 1110. The memory 1132 may store data 1166 that is accessible to the processor 1110.

The device 1100 includes a vertical tunnel field effect transistor device 1148. In an illustrative embodiment, the vertical tunnel field effect transistor device 1148 may correspond to the vertical tunnel field transistor devices depicted in FIGS. 1-9. The vertical tunnel field effect transistor device 118 may be used to form logic circuits in the processor 1110, other components (e.g., the display controller 1126, the wireless controller 1140, and/or a coder/decoder (CODEC) 1126) of the device 1100, or any combination thereof. In a particular embodiment, the logic circuits may be used for power conservation techniques. FIG. 11 also shows a display controller 1126 that is coupled to the processor 1110 and to a display 1128. The CODEC 1134 may also be coupled to the processor 1110. A speaker 1136 and a microphone 1138 may be coupled to the CODEC 1134. FIG. 11 also indicates that a wireless controller 1140 may be coupled to the processor 1110 and may be further coupled to an antenna 1142 via the RF interface 1152.

In a particular embodiment, the processor 1110, the display controller 1126, the memory 1132, the CODEC 1134, and the wireless controller 1140 are included in a system-in-package or system-on-chip device 1122. In a particular embodiment, an input device 1130 and a power supply 1144 are coupled to the system-on-chip device 1122. Moreover, in a particular embodiment, as illustrated in FIG. 11, the display 1128, the input device 1130, the speaker 1136, the microphone 1138, the antenna 1142, and the power supply 1144 are external to the system-on-chip device 1122. However, each of the display 1128, the input device 1130, the speaker 1136, the microphone 1138, the wireless antenna 1142, and the power supply 1144 may be coupled to a component of the system-on-chip device 1122, such as an interface or a controller.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The semiconductor chips are then integrated into electronic devices, as described further with reference to FIG. 12.

Figure 12:
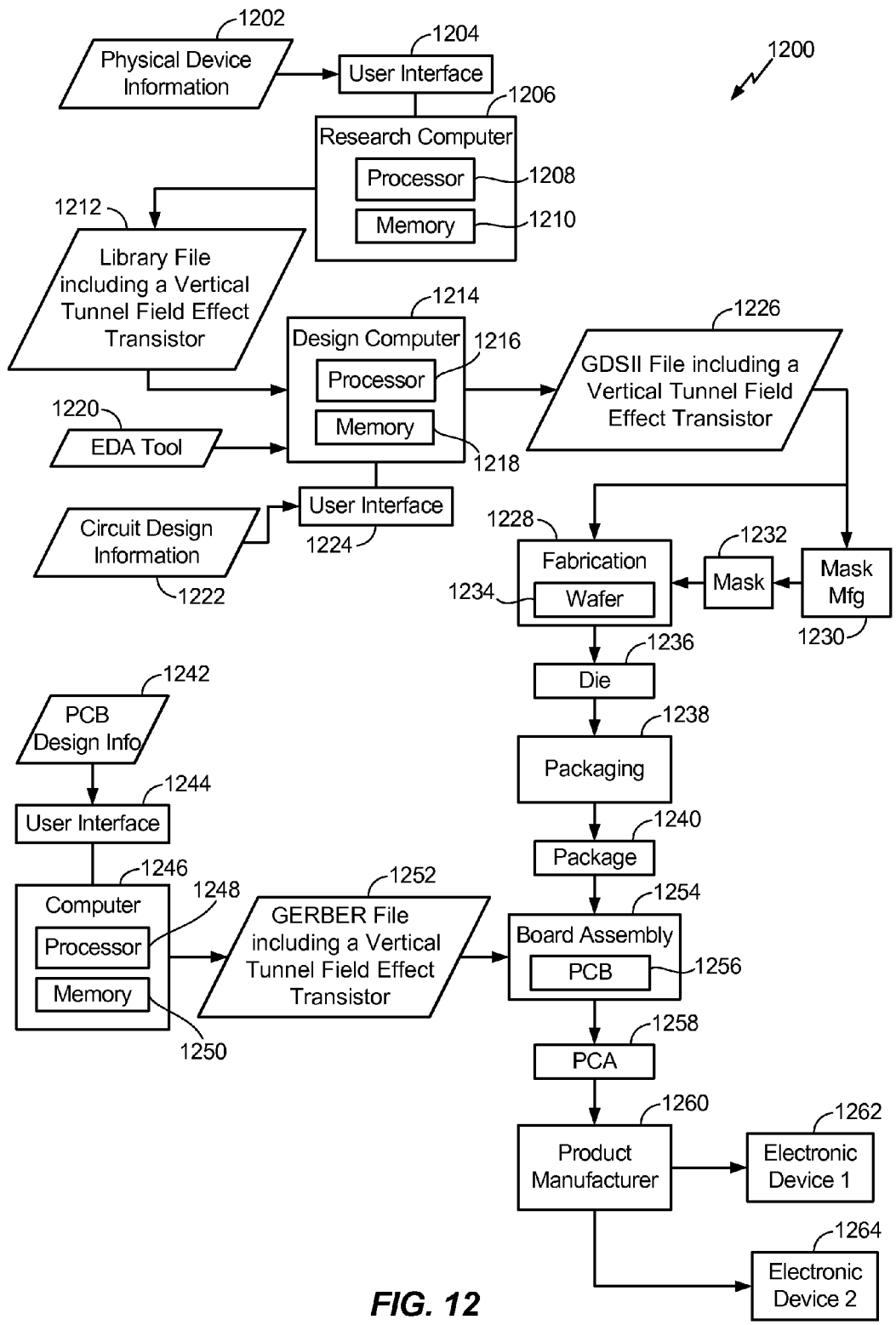
FIG. 12 is a data flow diagram of a particular illustrative embodiment of a process to manufacture electronic devices that include a vertical tunnel field effect transistor device.

Referring to FIG. 12, a particular illustrative embodiment of an electronic device manufacturing process is depicted and generally designated 1200. Physical device information 1202 is received at the manufacturing process 1200, such as at a research computer 1206. The physical device information 1202 may include design information representing at least one physical property of a semiconductor device, such as a vertical tunnel field effect transistor device (e.g., the vertical tunnel field effect transistor devices illustrated in FIGS. 1-9 and/or a vertical tunnel field effect transistor device formed according to the method 1000 of FIG. 10). For example, the physical device information 1202 may include physical parameters, material characteristics, and structure information that is entered via a user interface 1204 coupled to the research computer 1206. The research computer 1206 includes a processor 1208, such as one or more processing cores, coupled to a computer readable medium such as a memory 1210. The memory 1210 may store computer readable instructions that are executable to cause the processor 1208 to transform the physical device information 1202 to comply with a file format and to generate a library file 1212.

In a particular embodiment, the library file 1212 includes at least one data file including the transformed design information. For example, the library file 1212 may include a library of devices including a vertical tunnel field effect transistor device (e.g., the vertical tunnel field effect transistor devices illustrated in FIGS. 1-9 and/or a vertical tunnel field effect transistor device formed according to the method 1000 of FIG. 10) provided for use with an electronic design automation (EDA) tool 1220.

The library file 1212 may be used in conjunction with the EDA tool 1220 at a design computer 1214 including a processor 1216, such as one or more processing cores, coupled to a memory 1218. The EDA tool 1220 may be stored as processor executable instructions at the memory 1218 to enable a user of the design computer 1214 to design a vertical tunnel field effect transistor device (e.g., the vertical tunnel field effect transistor devices illustrated in FIGS. 1-9 and/or a vertical tunnel field effect transistor device formed according to the method 1000 of FIG. 10) using the library file 1212. For example, a user of the design computer 1214 may enter circuit design information 1222 via a user interface 1224 coupled to the design computer 1214. The circuit design information 1222 may include design information representing at least one physical property of a vertical tunnel field effect transistor device (e.g., the vertical tunnel field effect transistor devices illustrated in FIGS. 1-9 and/or a vertical tunnel field effect transistor device formed according to the method 1000 of FIG. 10). To illustrate, the circuit design property may include identification of particular circuits and relationships to other elements in a circuit design, positioning information, feature size information, interconnection information, or other information representing a physical property of a semiconductor device.

The design computer 1214 may be configured to transform the design information, including the circuit design information 1222, to comply with a file format. To illustrate, the file formation may include a database binary file format representing planar geometric shapes, text labels, and other information about a circuit layout in a hierarchical format, such as a Graphic Data System (GDSII) file format. The design computer 1214 may be configured to generate a data file including the transformed design information, such as a GDSII file 1226 that includes information describing a vertical tunnel field effect transistor device (e.g., the vertical tunnel field effect transistor devices illustrated in FIGS. 1-9 and/or a vertical tunnel field effect transistor device formed according to the method 1000 of FIG. 10) in addition to other circuits or information. To illustrate, the data file may include information corresponding to a system-on-chip (SOC) that includes a vertical tunnel field effect transistor device (e.g., the vertical tunnel field effect transistor devices illustrated in FIGS. 1-9 and/or a vertical tunnel field effect transistor device formed according to the method 1000 of FIG. 10), and that also includes additional electronic circuits and components within the SOC.

The GDSII file 1226 may be received at a fabrication process 1228 to manufacture a vertical tunnel field effect transistor device (e.g., the vertical tunnel field effect transistor devices illustrated in FIGS. 1-9 and/or a vertical tunnel field effect transistor device formed according to the method 1000 of FIG. 10), according to transformed information in the GDSII file 1226. For example, a device manufacture process may include providing the GDSII file 1226 to a mask manufacturer 1230 to create one or more masks, such as masks to be used with photolithography processing, illustrated as a representative mask 1232. The mask 1232 may be used during the fabrication process to generate one or more wafers 1234, which may be tested and separated into dies, such as a representative die 1236. The die 1236 includes a vertical tunnel field effect transistor device (e.g., the vertical tunnel field effect transistor devices illustrated in FIGS. 1-9 and/or a vertical tunnel field effect transistor device formed according to the method 1000 of FIG. 10).

In conjunction with the described embodiments, a non-transitory computer-readable medium stores instructions executable by a computer to perform the method 1000 of FIG. 10. For example, equipment of a semiconductor manufacturing plant may include a computer and a memory and may perform the method 1000 of FIG. 10, such as in connection with the fabrication process 1228 and using the GSDII file 1226. To illustrate, the computer may execute instructions to initiate fabrication of a vertical tunnel field effect transistor, as described with reference to FIGS. 2-8.

The die 1236 may be provided to a packaging process 1238 where the die 1236 is incorporated into a representative package 1240. For example, the package 1240 may include the single die 1236 or multiple dies, such as a system-in-package (SiP) arrangement. The package 1240 may be configured to conform to one or more standards or specifications, such as Joint Electron Device Engineering Council (JEDEC) standards.

Information regarding the package 1240 may be distributed to various product designers, such as via a component library stored at a computer 1246. The computer 1246 may include a processor 1248, such as one or more processing cores, coupled to a memory 1250. A printed circuit board (PCB) tool may be stored as processor executable instructions at the memory 1250 to process PCB design information 1242 received from a user of the computer 1246 via a user interface 1244. The PCB design information 1242 may include physical positioning information of a packaged semiconductor device on a circuit board, the packaged semiconductor device corresponding to the package 1240 including a vertical tunnel field effect transistor device (e.g., the vertical tunnel field effect transistor devices illustrated in FIGS. 1-9 and/or a vertical tunnel field effect transistor device formed according to the method 1000 of FIG. 10).

The computer 1246 may be configured to transform the PCB design information 1242 to generate a data file, such as a GERBER file 1252 with data that includes physical positioning information of a packaged semiconductor device on a circuit board, as well as layout of electrical connections such as traces and vias, where the packaged semiconductor device corresponds to the package 1240 including a vertical tunnel field effect transistor device (e.g., the vertical tunnel field effect transistor devices illustrated in FIGS. 1-9 and/or a vertical tunnel field effect transistor device formed according to the method 1000 of FIG. 10). In other embodiments, the data file generated by the transformed PCB design information may have a format other than a GERBER format.

The GERBER file 1252 may be received at a board assembly process 1254 and used to create PCBs, such as a representative PCB 1256, manufactured in accordance with the design information stored within the GERBER file 1252. For example, the GERBER file 1252 may be uploaded to one or more machines to perform various steps of a PCB production process. The PCB 1256 may be populated with electronic components including the package 1240 to form a representative printed circuit assembly (PCA) 1258.

The PCA 1258 may be received at a product manufacture process 1260 and integrated into one or more electronic devices, such as a first representative electronic device 1262 and a second representative electronic device 1264. As an illustrative, non-limiting example, the first representative electronic device 1262, the second representative electronic device 1264, or both, may be selected from the group of a cellular phone, a wireless local area network (LAN) device, a set top box, a music player, a video player, an entertainment unit, a navigation device, a communications device, a personal digital assistant (PDA), a fixed location data unit, and a computer, into which a vertical tunnel field effect transistor device (e.g., the vertical tunnel field effect transistor devices illustrated in FIGS. 1-9 and/or a vertical tunnel field effect transistor device formed according to the method 1000 of FIG. 10) is integrated. As another illustrative, non-limiting example, one or more of the electronic devices 1262 and 1264 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 13 illustrates remote units according to teachings of the disclosure, the disclosure is not limited to these illustrated units. Embodiments of the disclosure may be suitably employed in any device which includes active integrated circuitry including memory and on-chip circuitry.

A device that includes a vertical tunnel field effect transistor device (e.g., the vertical tunnel field effect transistor devices illustrated in FIGS. 1-9 and/or a vertical tunnel field effect transistor device formed according to the method 1000 of FIG. 10) may be fabricated, processed, and incorporated into an electronic device, as described in the illustrative process 1200. One or more aspects of the embodiments disclosed with respect to FIGS. 1-11 may be included at various processing stages, such as within the library file 1212, the GDSII file 1226, and the GERBER file 1252, as well as stored at the memory 1210 of the research computer 1206, the memory 1218 of the design computer 1214, the memory 1250 of the computer 1246, the memory of one or more other computers or processors (not shown) used at the various stages, such as at the board assembly process 1254, and also incorporated into one or more other physical embodiments such as the mask 1232, the die 1236, the package 1240, the PCA 1258, other products such as prototype circuits or devices (not shown), or any combination thereof. Although various representative stages are depicted with reference to FIGS. 1-11 to fabricate a vertical tunnel field effect transistor device, in other embodiments fewer stages may be used or additional stages may be included. Similarly, the process 1200 of FIG. 12 may be performed by a single entity or by one or more entities performing various stages of the process 1200.

In conjunction with the described embodiments, an apparatus includes means for providing charge carriers to a tunneling region. For example, the means for providing the charge carriers may include the first base portion 112, the first top portion 116, the second base portion 122, and the second top portion 126 depicted in FIGS. 1-9.

The apparatus may also include means for receiving the charge carriers from the tunneling region. For example, the means for receiving the charge carriers may include the first base portion 112, the first top portion 116, the second base portion 122, and the second top portion 126 depicted in FIGS. 1-9.

The apparatus may also include means for biasing the tunneling channel to enable band-to-band tunneling at the tunneling channel. For example, the means for biasing the tunneling channel may include the contacts 902-912 of FIG. 9, the voltages applied to the contacts 902-912 of FIG. 9, the processor 1110 of FIG. 10, or any combination thereof.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor may read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A tunnel field effect transistor (TFET) device comprising:
    a fin structure comprising:
        a base portion having a portion disposed in a recess of a substrate and protruding through a plane of a surface of the substrate;
        a top portion;
        a pair of sidewalls extending from a part of the base portion to the top portion;
        a first doped region having a first dopant concentration at the base portion; and
        a second doped region having a second dopant concentration at the top portion; and
    a gate comprising a first conductive structure neighboring a first sidewall of the pair of sidewalls; and
    a dielectric layer that electrically isolates the first conductive structure from the first sidewall.

2. The TFET device of claim 1, wherein the gate further comprises a second conductive structure neighboring a second sidewall of the pair of sidewalls, wherein the dielectric layer electrically isolates the second conductive structure from the second sidewall.

3. The TFET device of claim 2, wherein the gate further comprises a third conductive structure neighboring the top portion, wherein the dielectric layer electrically isolates the third conductive structure from the top portion, and wherein the third conductive structure is coupled to the first conductive structure and to the second conductive structure.

4. The TFET device of claim 1, wherein the fin structure further comprises a central portion between the base portion and the top portion.

5. The TFET device of claim 1, wherein the base portion, the top portion, and a central portion between the base portion and the top portion are comprised of a first type of material.

6. The TFET device of claim 1, wherein at least one of the base portion, the top portion, and a central portion between the base portion and the top portion comprises silicon.

7. The TFET device of claim 1, wherein:
    the top portion comprises an upper surface that is parallel to the surface of the substrate and is adjacent to another conductive structure of the gate, and
    a central portion between the base portion and the top portion corresponds to a channel region of the fin structure.

8. The TFET device of claim 1, wherein:
    a central portion between the base portion and the top portion corresponds to a channel region of the fin structure, and
    a channel length corresponds to a height of the central portion.

9. The TFET device of claim 1, wherein a saturation current is adjusted by changing a width of the gate.

10. The TFET device of claim 1, wherein the base portion corresponds to a drain of the fin structure and the top portion corresponds to a source of the fin structure.

11. The TFET device of claim 10, wherein the first dopant concentration includes an n-type concentration and the second dopant concentration includes a p-type concentration.

12. The TFET device of claim 10, wherein the first dopant concentration includes a p-type concentration and the second dopant concentration includes an n-type concentration.

13. The TFET device of claim 1, wherein the first doped region comprises a first material and the second doped region comprises a second material, and wherein the first material is different from the second material.

14. The TFET device of claim 1, wherein the base portion corresponds to a source of the fin structure and the top portion corresponds to a drain of the fin structure.

15. The TFET device of claim 14, wherein the first dopant concentration includes an n-type concentration and the second dopant concentration includes a p-type concentration.

16. The TFET device of claim 14, wherein the first dopant concentration includes a p-type concentration and the second dopant concentration includes an n-type concentration.

17. The TFET device of claim 1, integrated into at least one semiconductor die.

18. The TFET device of claim 1, integrated into a device selected from the group consisting of a communications device, a personal digital assistant (PDA), a navigation device, a fixed location data unit, a set top box, a music player, a video player, an entertainment unit, and a computer.

19. An apparatus comprising:
    means for providing charge carriers to a tunneling channel;
    means for receiving the charge carriers from the tunneling channel, wherein one of the means for providing or the means for receiving is at a base portion of a fin structure and is adjacent to a substrate surface, the base portion having a portion disposed in a recess of a substrate and protruding through a plane of a surface of the substrate, and wherein the other of the means for providing or the means for receiving is at a top portion of the fin structure; and
    means for biasing the tunneling channel to enable band-to-band tunneling at the tunneling channel.

20. The apparatus of claim 19, wherein the means for providing includes a source of the fin structure.

21. The apparatus of claim 19, wherein the means for receiving includes a drain of the fin structure.

22. The apparatus of claim 19, further comprising a device selected from the group consisting of a set top box, a music player, a video player, an entertainment unit, a navigation device, a communications device, a personal digital assistant (PDA), a fixed location data unit, and a computer, into which the means for providing, the means for receiving, and the means for biasing are integrated.

* * * * *